United States Patent
Coumou et al.

(10) Patent No.: US 12,061,215 B2
(45) Date of Patent: Aug. 13, 2024

(54) RF MEASUREMENT FROM A TRANSMISSION LINE SENSOR

(71) Applicant: Applied Materials, Inc., Santa Clara, CA (US)

(72) Inventors: David Coumou, Webster, NY (US); Xiaopu Li, San Jose, CA (US); Michelle SanPedro, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 211 days.

(21) Appl. No.: 17/737,682

(22) Filed: May 5, 2022

(65) Prior Publication Data

US 2023/0358790 A1 Nov. 9, 2023

(51) Int. Cl.
*G01R 19/00* (2006.01)
*G01R 15/18* (2006.01)
*G01R 19/165* (2006.01)
*G01R 19/25* (2006.01)

(52) U.S. Cl.
CPC ......... *G01R 19/0007* (2013.01); *G01R 15/18* (2013.01); *G01R 19/16533* (2013.01); *G01R 19/2513* (2013.01)

(58) Field of Classification Search
CPC ............. G01R 19/0007; G01R 15/18; G01R 19/16533; G01R 19/2513; G01R 15/181; G01R 15/142; H01F 27/2804; H05H 1/00
USPC ......................................................... 324/522
See application file for complete search history.

(56) References Cited

U.S. PATENT DOCUMENTS

| | | | |
|---|---|---|---|
| 2001/0008375 A1 | 7/2001 | Yag | |
| 2009/0058398 A1 | 3/2009 | Ibuki | |
| 2013/0285644 A1* | 10/2013 | Ibuki | G01R 15/181 |
| | | | 324/127 |
| 2018/0191326 A1* | 7/2018 | Liu | H01F 27/2804 |
| 2021/0407775 A1 | 12/2021 | Moses et al. | |

FOREIGN PATENT DOCUMENTS

| | | | | |
|---|---|---|---|---|
| CN | 108227839 A | * | 6/2018 | ........... G06F 1/1681 |
| CN | 111381084 A | | 7/2020 | |
| CN | 211827459 U | | 10/2020 | |
| JP | 2004518384 A | * | 6/2004 | ......... H01F 27/2804 |

OTHER PUBLICATIONS

International Search Report and Written Opinion from PCT/US2023/018501 dated Aug. 1, 2023, 9 pgs.

* cited by examiner

*Primary Examiner* — Tung X Nguyen
*Assistant Examiner* — Robert P Alejnikov, Jr.
(74) *Attorney, Agent, or Firm* — Schwabe, Williamson & Wyatt, P.C.

(57) ABSTRACT

Embodiments disclosed herein include a sensor. In an embodiment, the sensor comprises a board, wherein an aperture is formed through the board, a current loop winding through the board around the aperture, and a voltage ring around the aperture and within an inner perimeter of the current loop, wherein the voltage ring comprises an interior ring, an insulator ring around the interior ring, and an exterior ring around the insulator ring.

15 Claims, 10 Drawing Sheets

RF MEASUREMENT FROM A TRANSMISSION LINE SENSOR

BACKGROUND

1) Field

Embodiments relate to the field of semiconductor manufacturing and, in particular, to a sensor for measuring voltage and current in a semiconductor tool.

2) Description of Related Art

In plasma processing tools, the plasma is ignited by a cathode that is coupled to processing gasses within a chamber. In most tools, a power supply is coupled to the cathode through an impedance matching network (sometimes referred to simply as a "match"). The match allows for the impedance of the system to be adjusted in order to match the impedance of the load to which the cathode is coupled. The load has a wide range of impedances that are dictated by parameters such as processing conditions, chamber architecture, and the like. Matching the impedances is important in order to provide efficient power transfer from the power supply to the load.

RF coupled sensors are used to provide feedback in order to change impedance varying devices to vary the impedance of the match. However, currently existing sensors are not without issues. For one, parasitic effects are not adequately controlled, and this limits the effective frequency of operation. Additionally, sensor parasitics and port mutual coupling impair the sensors dynamic range due to cross coupling. In yet another issue, multiple sensors constructed on a common printed circuit board (PCB) may result in sensor-to-sensor coupling, which impairs sensor measurements.

SUMMARY

Embodiments disclosed herein include a sensor. In an embodiment, the sensor comprises a board, wherein an aperture is formed through the board, a current loop winding through the board around the aperture, and a voltage ring around the aperture and within an inner perimeter of the current loop, wherein the voltage ring comprises an interior ring, an insulator ring around the interior ring, and an exterior ring around the insulator ring.

In an additional embodiment, a sensor is described. In an embodiment, the sensor comprises a board, wherein an aperture is provided through the board, a current loop around the aperture, wherein the current loop comprises, an inner set of vias, an outer set of vias, and a plurality of conductive traces, wherein each conductive trace couples a via of the inner set of vias to a via of the outer set of vias, and wherein the plurality of conductive traces alternate from being on a top surface of the board and on a bottom surface of the board, and a voltage ring within an inner perimeter of the current loop, wherein the voltage ring comprise an interior ring, an insulator ring around the interior ring, and an exterior ring around the insulator ring.

In an embodiment, a processing tool is described. In an embodiment, the processing tool comprises a power supply, an impedance matching network coupled to the power supply, a cathode, wherein the power supply is configured to supply power through the impedance matching network to the cathode, a processing module, wherein the processing module is communicatively coupled to the power supply and the impedance matching network, a first sensor provided upstream of the impedance matching network and a second sensor provided downstream of the impedance matching network, wherein the first sensor and the second sensor each comprises, a board, wherein an aperture is formed through the board, a current loop winding through the board around the aperture, and a voltage ring around the aperture and within an inner perimeter of the current loop, wherein the voltage ring comprises an interior ring, an insulator ring around the interior ring, and an exterior ring around the insulator ring.

DETAILED DESCRIPTION

Figure 1:
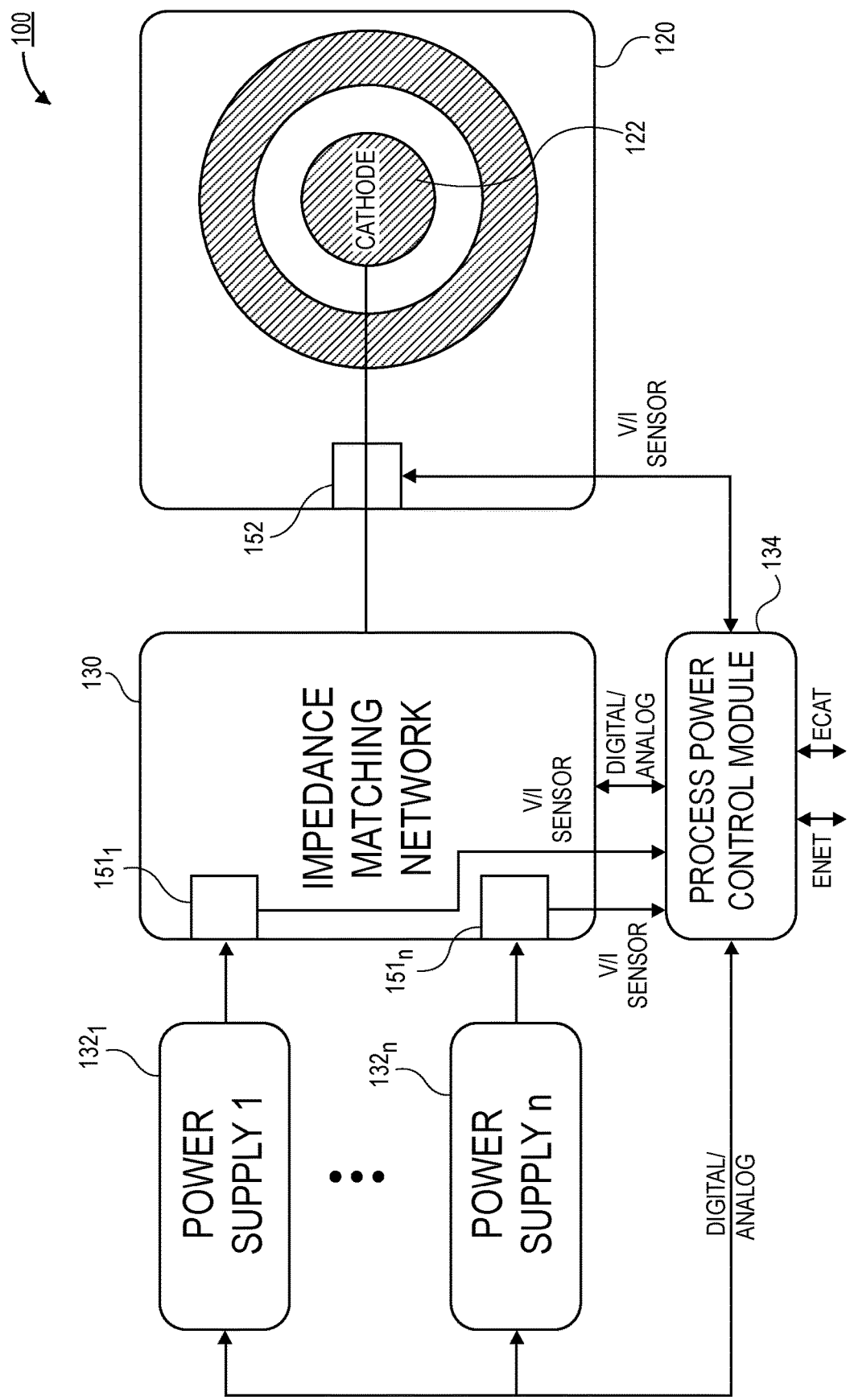
FIG. 1 is a schematic of a plasma processing tool that includes a centralized control architecture, in accordance with an embodiment.

Systems described herein include a sensor for measuring voltage and current in a semiconductor tool from a transmission line sensor. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, existing sensor devices are limited. Accordingly, impedance matching networks cannot be operated in ideal conditions. Therefore, embodiments disclosed herein include sensors that have improved performance. As used herein a sensor may refer to a sensor that is capable of measuring current and/or voltage along a coaxial transmission line section. In a particular embodiment, the sensor includes an aperture, and a conductive device with concentric electrically insulating material (e.g., an RF cable) passes through the aperture. Features on the sensor are able to pick up the current and voltage passing along the transmission line. For example, a current loop picks up the current, and a voltage ring detects the voltage. The current and voltage measurements may then be used as sensor measurement feedback in order to direct changes to the impedance of an impedance matching network.

In a particular embodiment, sensors described herein exhibit reduced parasitic coupling between pick-up elements. This allows for greater dynamic range across a wider frequency range of operation. In some embodiments, baluns are included along the current loop. This allows for an increase in the magnetic field coupling and amplification of current loop induction. In yet another embodiment, isolation between sensor pickup elements (for current and voltage) reduce cross coupling between sensor ports. This allows for a greater dynamic range across a wider frequency range of operation. Some embodiments may include multiple sensors within a single printed circuit board (PCB). In such embodiments, a guard ring may be provided around each sensor in order to eliminate cross coupling between concentric sensor elements. This enables high fidelity measurements and accuracy across a wider dynamic range, and simultaneously, broaden the frequency range.

In a particular embodiment, the sensors described herein are part of a plasma processing tool. Generally, the plasma processing tool includes a chamber with a cathode. A power supply architecture provides power to the cathode. For example, the power supply architecture includes one or more power supplies and an impedance matching network. The sensors described herein may be provided upstream of the impedance matching network and/or downstream of the impedance matching network. The sensors may provide feedback to a process power processing module that controls the power supplies coupled to the plasma's bulk and sheath voltage and the impedance matching network.

Referring now to FIG. 1, a more detailed schematic of a plasma processing tool 100 is shown, in accordance with an embodiment. In an embodiment, the plasma processing tool 100 includes a plasma chamber 120. The plasma chamber 120 includes a cathode 122 in order to couple the power received to one or more gasses flown into the plasma chamber 120. In an embodiment, the plasma chamber 120 may be suitable for any plasma process typical of semiconductor manufacturing environments. For example, the plasma chamber 120 may be a plasma etching chamber, a plasma deposition chamber, a plasma treatment chamber, or the like. In a particular embodiment, the plasma chamber 120 may be a plasma enhanced chemical vapor deposition (PECVD) chamber, a physical vapor deposition (PVD) chamber, or a plasma enhanced atomic layer deposition (PEALD) chamber.

In an embodiment, the plasma chamber 120 may be coupled to a power delivery architecture. For example, the power delivery architecture may include one or more power supplies $132_1$-$132_n$. In the illustrated embodiment, a plurality of power supplies 132 are shown. However, it is to be appreciated that a single power supply 132 may be used in some embodiments. In an embodiment, the power supplies 132 may include any type of power supply. For example, the power supplies 132 may be RF power supplies, microwave power supplies, direct current (DC) power supplies, pulsed DC power supplies, or the like. The transmission line sensor with extended dynamic range and broaden operating frequency response enables a wider corpus of plasma driving power sources.

In an embodiment, the power supplies 132 may be coupled to the cathode 122 through an impedance matching network 130. The impedance matching network 130 adjusts the impedance of the power delivery architecture in order to match the load in the chamber 120. Due to changes in processing conditions (e.g. gas flow rates, pressure, temperature, etc.) the impedance of the load can vary. As such, the impedance matching network 130 is used to match the changing impedance in order to provide efficient and optimal power delivery to the coupled plasma in the chamber (i.e., with no or minimal reflected power).

In an embodiment, sensors 151 and 152 may be provided on opposite ends of the impedance matching network 130. For example, sensors $151_1$-$151_n$ may be on an upstream side of the impedance matching network 130, and sensor 152 may be on a downstream side of the impedance matching network 130. The "upstream" side may refer to the input side of the impedance matching network 130, and the "downstream" side may refer to the output side of the impedance matching network 130. As shown, a plurality of sensors $151_1$-$151_n$ are provided on the upstream side of the impedance matching network 130. The number of sensors 151 may be equal to the number of power supplies 132. That is, each power supply 132 may have a dedicated sensor 151. The downstream side of the impedance matching network 130 may have a single sensor 152. However, it is to be appreciated that when there is more than one output from the matching network 130, there may be additional sensors 152. For example, in a case where there is two outputs (e.g., for a center of the chamber 120 and an edge of the chamber 120), there may be two sensors 152.

In the case of multiple sensors 151, the plurality of sensors $151_{1-n}$ may be fabricated on a single PCB. That is, a single module may include multiple sensors. A more detailed description of the multi-sensor embodiment is provided below. Generally, embodiments described herein include electrical shielding techniques that limit the cross coupling between sensors on a single PCB.

In FIG. 1, the sensors 151 and 152 are shown generally as blocks. However, it is to be appreciated that the sensors 151 and 152 may be similar to any of the sensor architectures described in greater detail below. For example, each sensor 151 and/or 152 may be a voltage and current (i.e., V/I) sensor. The voltage may be detected by an embedded voltage ring, and the current may be detected by a current loop. The sensors each having an aperture through which conductive device with concentric electrically insulating material (e.g., an RF cable) passes.

In an embodiment, the sensors 151 and 152 may be communicatively coupled with a processing module 134. As shown, a generic process power control module 134 is provided in FIG. 1. However, it is to be appreciated that the processing module may be a microwave processing module 134, a DC processing module, an RF processing module or the like, depending on what type of power supplies 132 are included in the tool 100. In an embodiment, the sensors 151 and 152 deliver the voltage and/or current to the processing module 134. In an embodiment, the process power control module 134 may have external connections for different physical layers and protocols, such as an Ethernet (ENET) and a standardized industrial connection, like EtherCAT.

In an embodiment, the processing module 134 may be coupled to the impedance matching network. The processing module 134 may be able to send control signals to the impedance matching network 130. For example, control signals may be used to adjust the capacitance of variable capacitors within the impedance matching network 130. Additionally, the processing module 134 may be coupled to the power supplies 132 by a. As such, the processing module 134 is capable of coordinated impedance tuning.

Figure 2A:
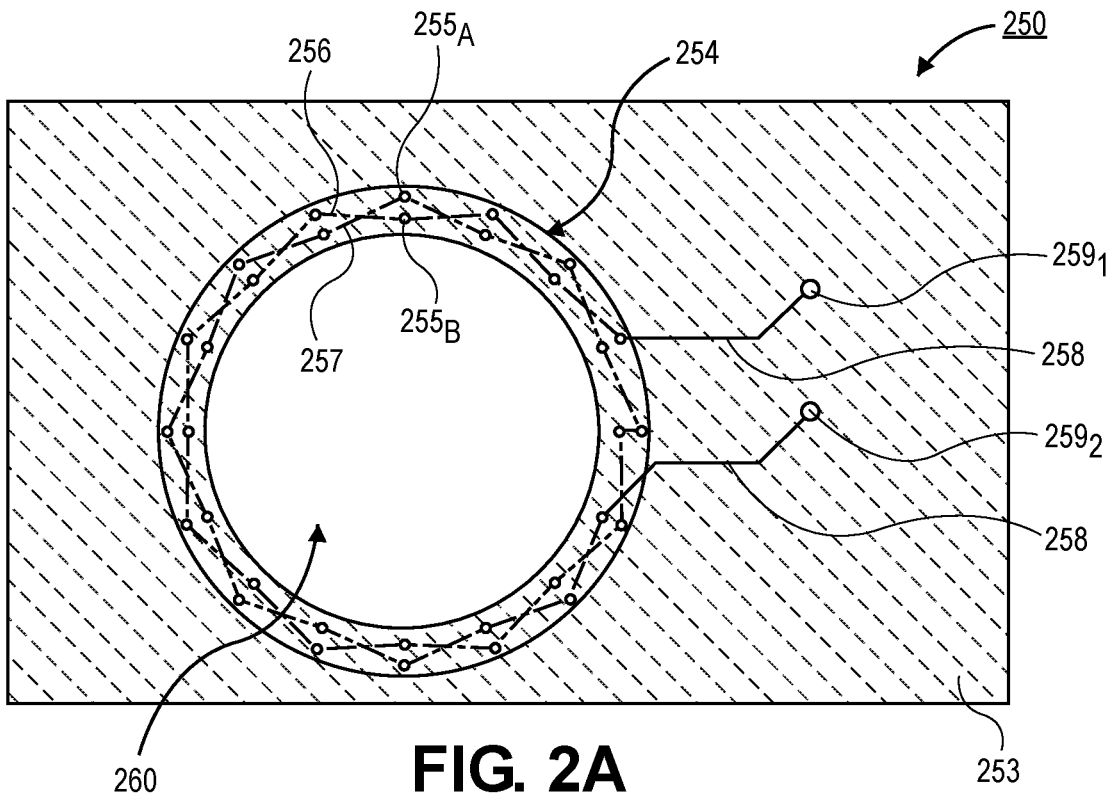
FIG. 2A is a plan view illustration of current loop of a sensor, in accordance with an embodiment.

Referring now to FIG. 2A, a plan view illustration of a portion of a sensor 250 is shown, in accordance with an embodiment. In an embodiment, the sensor 250 may comprise a PCB 253. The PCB 253 may include two or more routing layers. Each of the routing layers may be separated from each other by dielectric layers. In an embodiment, vias may pass through dielectric layers in order to provide electrical coupling between routing layers.

In an embodiment, the sensor 250 may include a current loop 254. The current loop 254 may comprise one or more conductive windings that encircle an aperture 260 through the PCB 253. In the particular embodiment shown in FIG. 2A, the current loop 254 includes two windings. However, it is to be appreciated that one winding or more than two windings may be used in other embodiments. In an embodiment, each winding is comprised of traces 256 (solid lines) that are on the top surface of the PCB 253 and traces 257 (dashed lines) that are on the bottom surface of the PCB 253. The transition through the PCB 253 may be provided by vias 255. As shown, a first concentric ring of vias $255_A$ and a second concentric ring of vias $255_B$ are provided around the aperture 260. Each via $255_A$ is paired with a via $255_B$. In some instances, vias $255_A$ may be referred to as outer vias and vias $255_B$ may be referred to as inner vias.

As shown, the windings alternate from being implemented as a trace 256 on the top surface of the PCB 253 and implemented as a trace 257 on the bottom surface of the PCB 253. Additionally, each winding alternates between inner vias $255_B$ and outer vias $255_A$. Furthermore, the windings cross over each other. For example, between a first pair of vias $255_A$ and $255_B$ and a second, adjacent, pair of vias $255_A$ and $255_B$, the first winding may pass along the top surface of the PCB 253 as a trace 256, and the second winding may pass along the bottom surface of the PCB 253 as a trace 257.

In an embodiment, a first end of the current loop 254 may be coupled to a pad 2591 by a trace 258. Similarly, a second end of the current loop 254 may be coupled to a pad 2592 by a trace 258. In an embodiment, the first end of the current loop 254 and the second end of the current loop 254 may be provided on the same surface of the PCB 253. For example, in FIG. 2A the pads 2591 and 2592 are provided on the top surface of the PCB 253.

In the illustrated embodiment, sixteen inner vias $255_B$ and sixteen outer vias $255_A$ are shown (for a total of thirty two vias 255). However, it is to be appreciated that more or fewer vias 255 may be used, in accordance with various embodiments. In a particular embodiment, there may be twenty four inner vias $255_B$ and twenty four outer vias $255_A$ (for a total of forty eight vias 255). In some instances, increasing the number of vias 255 may increase the degree of coupling with the magnetic field of a cable through the aperture 260. As such, improved sensor performance may be obtained.

Figure 2B:
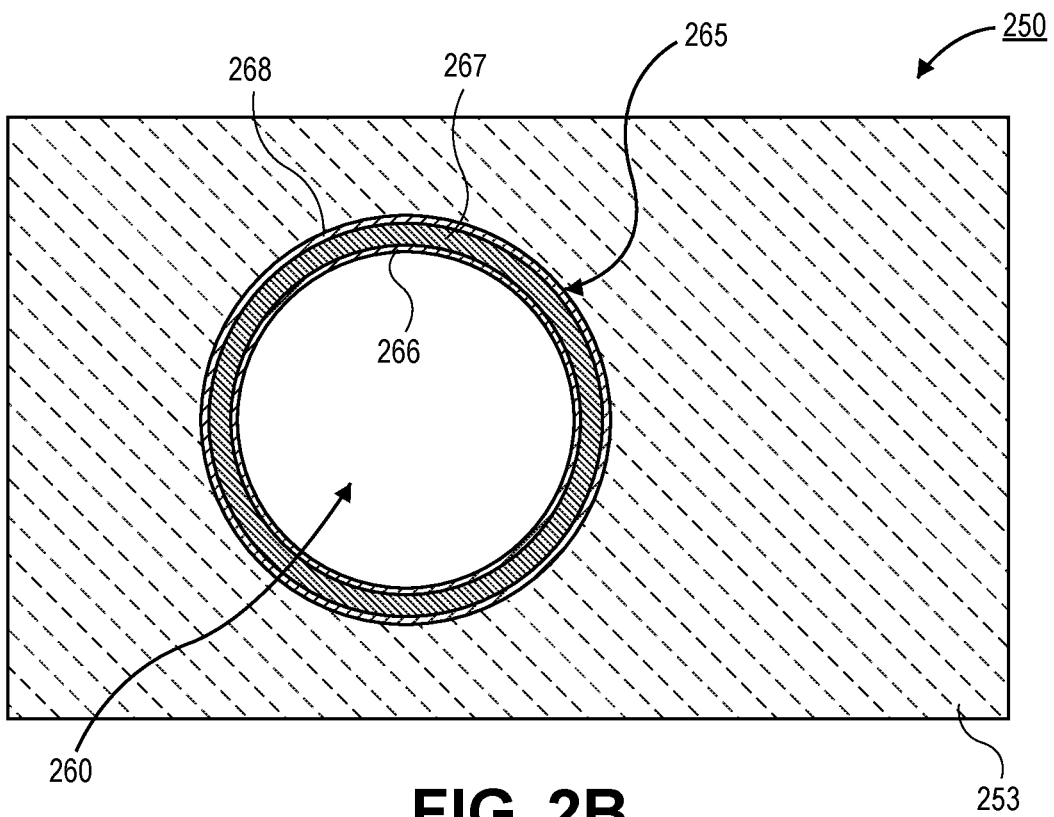
FIG. 2B is a plan view illustration of a voltage ring of a sensor, in accordance with an embodiment.

Referring now to FIG. 2B, a plan view illustration of a portion of a sensor 250 is shown, in accordance with an embodiment. In an embodiment, the sensor 250 in FIG. 2B illustrates the voltage pickup structure. For example, an embedded voltage ring 265 may be inserted into the PCB 253 surrounding the aperture 260. More specifically, it is noted that the voltage ring 265 is physically inserted into the PCB 253, and is not etched from conventional PCB material. This creates a 3D type of PCB assembly. While shown as distinct sensors 250 for clarity, it is to be appreciated that the current loop 254 and the voltage ring 265 may be implemented on a single PCB 253. In such embodiments, the voltage ring 265 may be provided around the aperture 260 within an inner perimeter of the current loop 254.

In an embodiment, the voltage ring 265 may include a first electrically conductive ring 266 and a second electrically conductive ring 268. In an embodiment, an insulating ring 267 may be provided between the first electrically conductive ring 266 and the second electrically conductive ring 268. In a particular embodiment, the first electrically conductive ring 266 and the second electrically conductive ring 268 may comprise copper or another conductive material. The first electrically conductive ring 266 and the second electrically conductive ring 268 may be concentric rings with each other. Thicknesses of the first conductive ring 266 and the second conductive ring 268 may be substantially equal to a thickness of the PCB 253.

In an embodiment, the first ring 266 may be used as the voltage pickup surface. The second ring 268 may be grounded. That is, the second ring 268 may be connected to an electrical ground. While not shown, it is to be appreciated that tabs connected to either the first ring 266 and/or the second ring 268 may be folded over a top and/or bottom surface of the insulating ring 267. In an embodiment, the embedded voltage ring 265 is concentric to the aperture 260 through the PCB 253. In an embodiment, the embedded voltage ring 265 is inset into the aperture 260. In other embodiments, the embedded voltage ring is internally embedded into the fabric of the PCB 253.

Figure 3A:
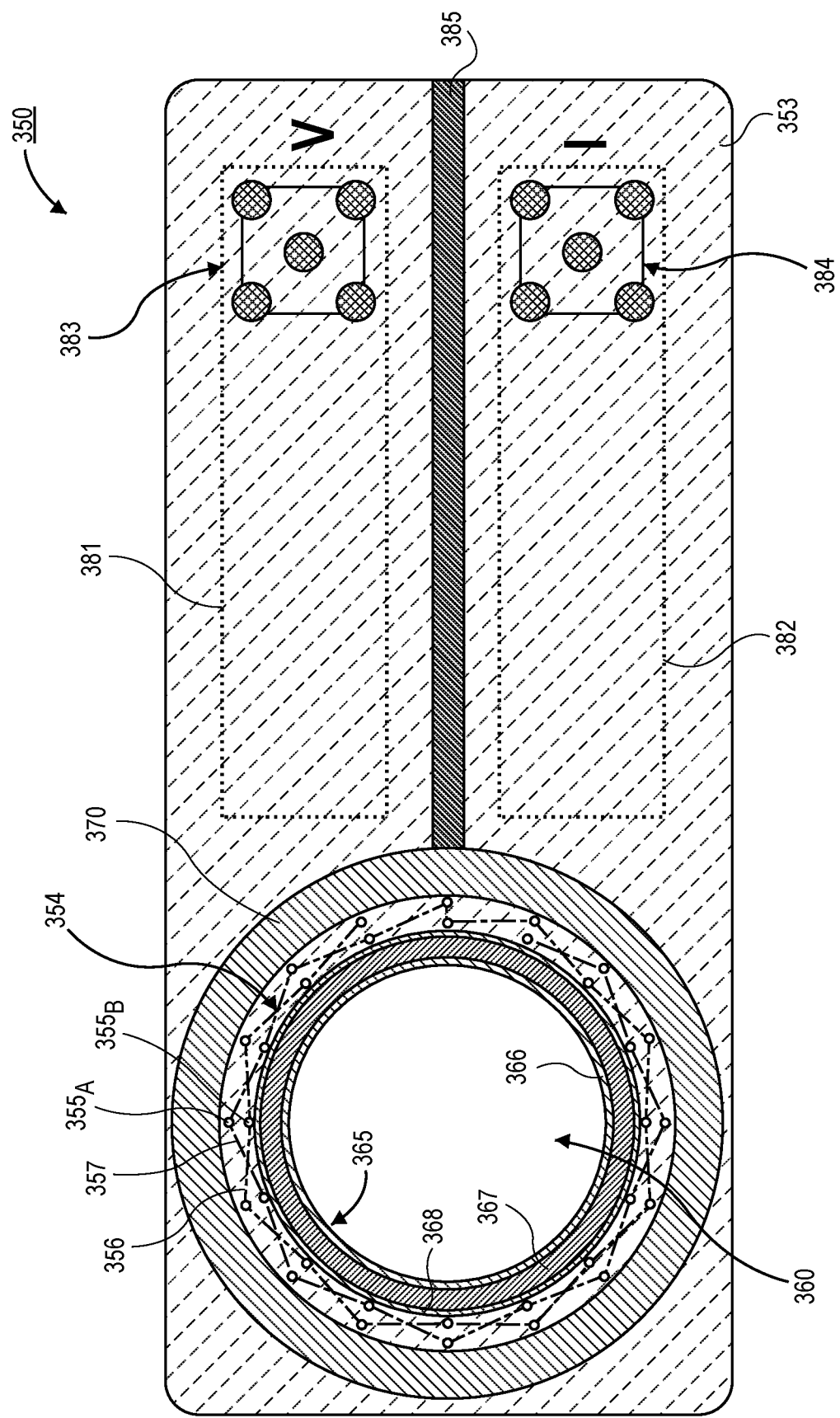
FIG. 3A is a plan view illustration of a sensor with a current loop, a voltage ring, and a guard ring, in accordance with an embodiment.

Referring now to FIG. 3A, a plan view illustration of sensor 350 is shown, in accordance with an embodiment. As shown, the sensor 350 is fabricated on a PCB 353. The sensor 350 may include a current loop 354 and a voltage ring 365 within the current loop 354. The current loop 354 and the voltage ring 365 may surround an aperture 360 through the PCB 353.

In an embodiment, the current loop 354 may include inner vias $355_B$ and outer vias $355_A$. The vias 355 may be coupled to each other by traces 356 on a top surface of the PCB 353 and by traces 357 on a bottom surface of the PCB 353. In the illustrated embodiment, the current loop 354 includes a pair of windings around the aperture 360. In an embodiment, the current loop 354 may be substantially similar to the current loop 254 described in greater detail above.

In an embodiment, the voltage ring 365 may include an inner conductive ring 366 and an outer conductive ring 368. An insulating ring 367 may be provided between the inner ring 366 and the outer ring 368. The inner ring 366 may be the voltage pickup surface and the outer ring 368 may be grounded. In an embodiment, the inner ring 366 may define the outer perimeter of the aperture 360. The voltage ring 365 may be substantially similar to the voltage ring 265 described in greater detail above.

In an embodiment, the sensor 350 may further comprise a guard ring 370 that surrounds an outer perimeter of the current loop 354. In an embodiment, the guard ring 370 may be grounded. The guard ring 370 may include vias (not shown) that couple the guard ring 370 to a ring on the bottom side of the PCB 353 with a similar size and shape. As such, an electrically shielding barrier is provided around the pickup components of the sensor 350. Accordingly, sensor performance can be increased.

In an embodiment, the voltage ring 365 may be coupled to pickup circuitry 381 on the PCB 353. The pickup circuitry 381 in FIG. 3A is shown schematically as a dashed box. However, it is to be appreciated that the pickup circuitry 381 may include features, such as filters, amplifiers, and the like. In an embodiment, pads 383 are provided. The pads 383 may be suitable for attaching a connector (not shown) in order to feed voltage information back to a processing module, such as the processing module described in greater detail above.

In an embodiment, the current loop 354 may be coupled to pickup circuitry 382 on the PCB 353. The pickup circuitry 382 in FIG. 3A is shown schematically as a dashed box. However, it is to be appreciated that the pickup circuitry 382 may include features, such as filters, amplifiers, and the like. In an embodiment, pads 384 are provided. The pads 384 may be suitable for attaching a connector (not shown) in order to feed current information back to a processing module, such as the processing module described in greater detail above.

In an embodiment, the pickup circuitry 381 is electrically isolated from the pickup circuitry 382. Electrically isolating the two sets of pickup circuitry 381 and 382 enables a reduction in cross-coupling between the two circuits. As such, performance of the sensor 350 may be improved. In an embodiment, the electrical isolation may be provided by a conductive strip 385 that is provided between the two sets of pickup circuitry 381 and 382. In an embodiment, the conductive strip 385 may be grounded. In some embodiments, the conductive strip 385 is electrically coupled to the guard ring 370. The conductive strip 385 may be provided on a top surface of the PCB 353. In other embodiments, vias may be provided below the strip 385 in order to extend the electrical isolation through a thickness of the PCB 353.

Figure 3B:
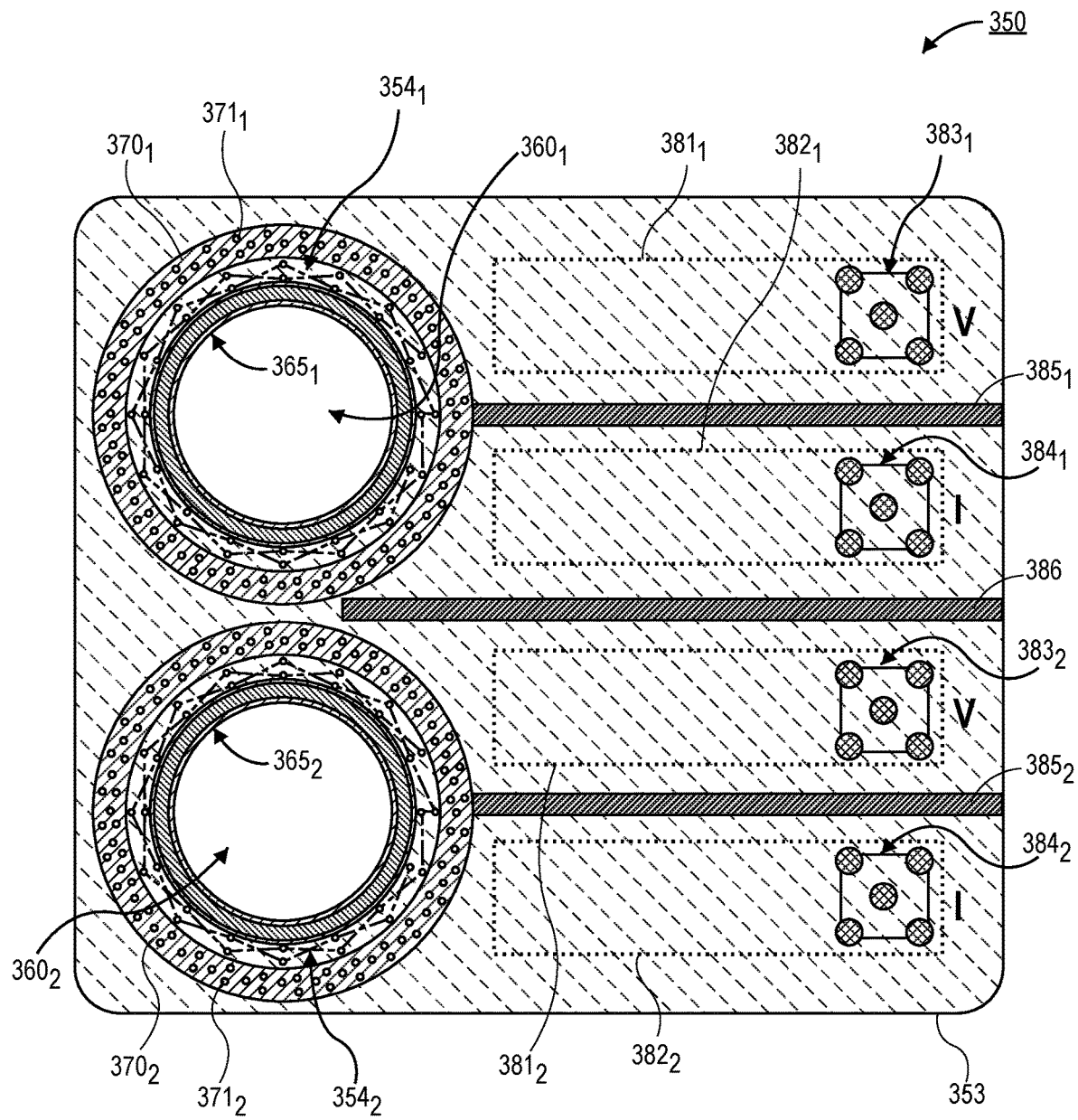
FIG. 3B is a plan view illustration of a printed circuit board with a pair of sensors, in accordance with an embodiment.

Referring now to FIG. 3B, a plan view illustration of a sensor 350 is shown, in accordance with an additional embodiment. In the embodiment shown in FIG. 3B, the sensor 350 may include a pair of apertures 3601 and 3602. Each aperture 360 may be surrounded by a current loop 354 and a voltage ring 365. For example, current loop 3541 and voltage ring 3651 are around aperture 3601, and current loop 3542 and voltage ring 3652 are around aperture 3602. Similarly, a first guard ring 3701 may be around the current loop 3541, and a second guard ring 3702 may be around the current loop 3542. While two sets of pickup elements are shown, it is to be appreciated that any number of apertures 360 and corresponding current loops 354, voltage rings 365, and guard rings 370 may be included on the PCB 353. The current loops 354 and the voltage rings 365 may be substantially similar to the current loops 254 and voltage rings 265 described in greater detail above.

As shown in FIG. 3B, the guard rings 370 include vias 371. Vias 3711 are below the guard ring 3701, and vias 3712 are below the guard ring 3702. In an embodiment, the positioning of the vias 3711 and 3712 may be rotated with respect to each other. Rotating the orientation of the vias 371 may result in even greater electrical isolation between the two sets of pickup elements.

In an embodiment, the voltage ring 3651 may be coupled to pickup circuitry 3811 and pads 3831, and the current loop 3541 may be coupled to pickup circuitry 3821 and pads 3841. Similarly, voltage ring 3652 may be coupled to pickup circuitry 3812 and pads 3832, and current loop 3542 may be coupled to pickup circuitry 3822 and pads 3842. The pickup circuitry 381/382 may be substantially similar to the pickup circuitry described in greater detail above.

In order to provide electrical isolation between the various instances of the pickup circuitry 381/382 conductive strips 3851 and 3852 may be provided. In order to provide electrical isolation between pickup circuitry 3821 and 3812, a conductive strip 386 may be provided. The conductive strips 385 and 386 may be on the top surface of the PCB 353. In other embodiments, vias below the conductive strips 385 may extend the electrical isolation through a thickness of the PCB 353. In an embodiment, the conductive strips 385 and 386 may be grounded.

Figure 4A:
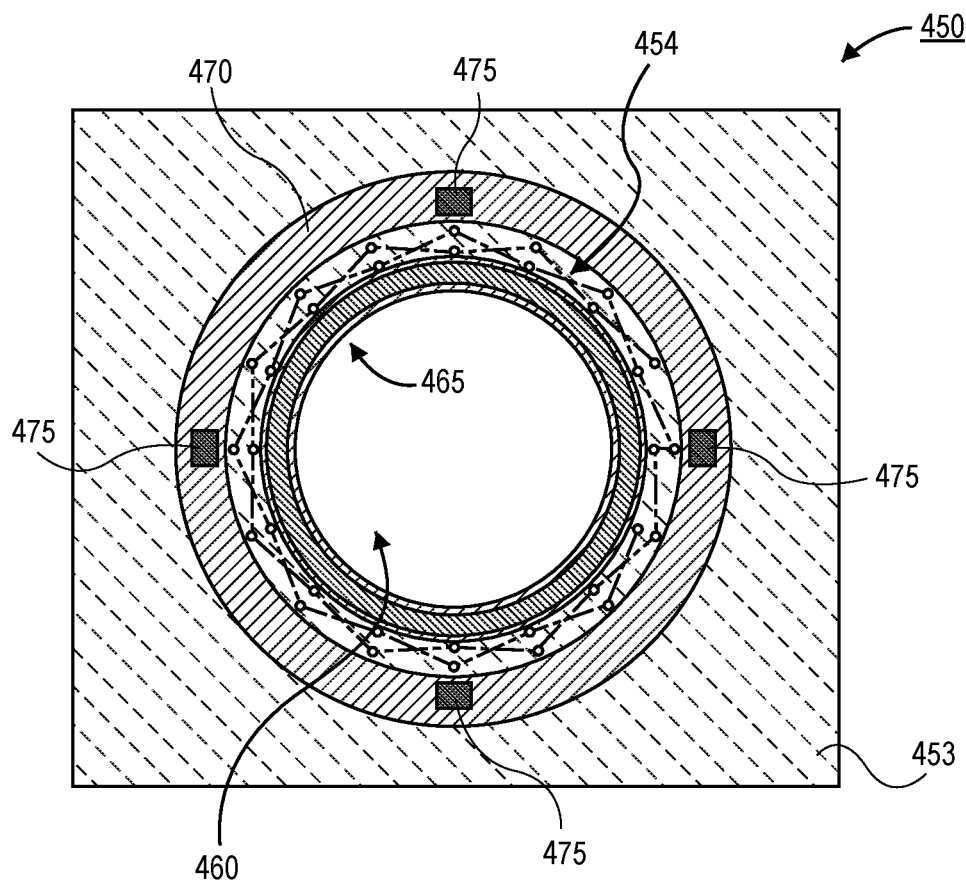
FIG. 4A is a plan view illustration of a sensor with a plurality of baluns coupled to the current loop, in accordance with an embodiment.

Referring now to FIG. 4A, a plan view illustration of a sensor 450 is shown, in accordance with an embodiment. In an embodiment, the sensor 450 may comprise a PCB 453 with an aperture 460. In an embodiment, the pickup elements may include a current loop 454 and a voltage ring 465. The current loop 454 and the voltage ring 465 may be substantially similar to the current loops and voltage rings described in greater detail above. In an embodiment, the sensor 450 may also include a guard ring 470 that surrounds an outer perimeter of the current loop 454.

In an embodiment, the current loop 454 may be electrically coupled to one or more baluns 475. The baluns 475 in FIG. 4A are illustrated as being set in cutouts into the guard ring 475. However, it is to be appreciated that the baluns 475 may be provided at any convenient location on the PCB 453. In the illustrated embodiment, four baluns 475 are provided. However, it is to be appreciated that any number of baluns 475 may be used. The presence of the baluns 475 may increase the signal-to-noise ratio and enable improved sensor performance. In a particular embodiment, each balun 475 may double the amount of current. In an embodiment, the transformer arrangements are evenly distributed for each loop, with each transformer arrangement geometrically located 180 degrees opposite from its pair. For example, a four transformer arrangement would be located with a pair per loop, and the pairs are radially separated by 180 degrees.

Figure 4B:
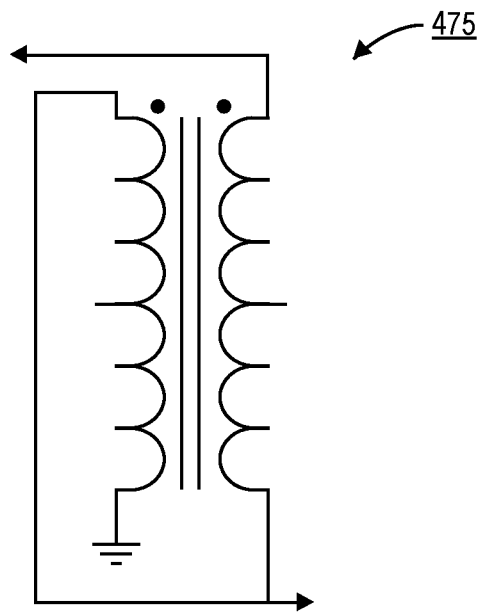
FIG. 4B is a circuit diagram of a balun that may be used in a sensor, in accordance with an embodiment.

Referring now to FIG. 4B, an electrical circuit of a balun 475 is shown, in accordance with an embodiment. In an embodiment, the balun 475 may be include a transformer based circuitry. While a particular balun 475 architecture is shown in FIG. 4B, it is to be appreciated that the balun 475 circuitry may include any suitable structure that provides the functionality of a balun.

Figure 5A:
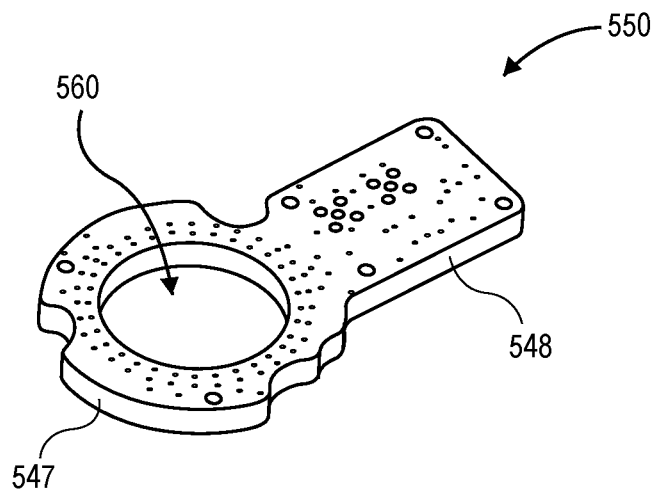
FIG. 5A is a perspective view illustration of a sensor, in accordance with an embodiment.

Referring now to FIG. 5A, a perspective view illustration of a sensor 550 is shown, in accordance with an embodiment. In an embodiment, the sensor 550 may include a roughly circular end 547 and a rectangular end 548. The circular end 547 may include an aperture 560 through which a cable or the like passes. In an embodiment, a current loop and a voltage ring (both not shown for simplicity) are provided around the aperture 560. In an embodiment, the rectangular end 548 may be used to support the pickup circuitry and connectors.

Figure 5B:
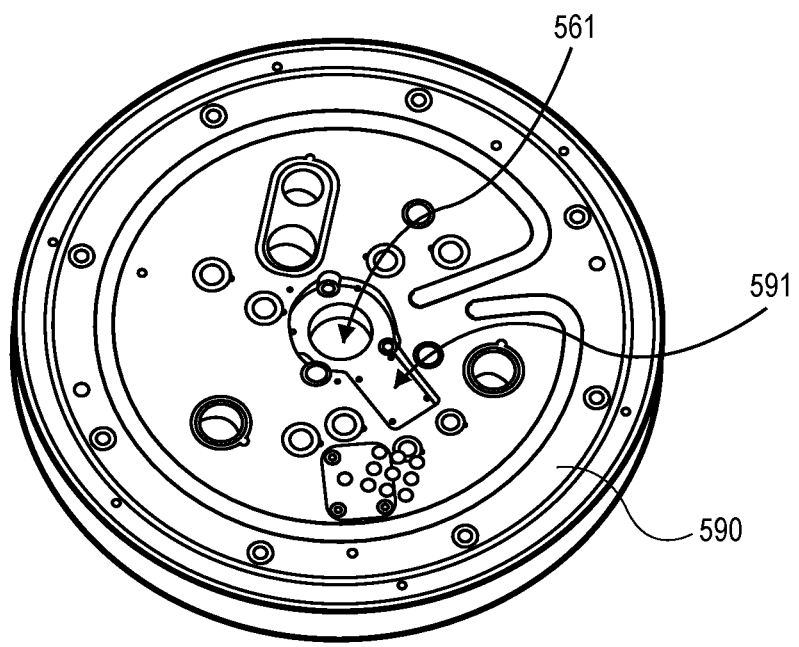
FIG. 5B is a perspective view illustration of a ground plate with a cutout for the sensor, in accordance with an embodiment.

Referring now to FIG. 5B, a perspective view illustration of a ground plate 590 of a fixed cathode device is shown, in accordance with an embodiment. As shown, the ground plate 590 may include a cutout 591 that substantially matches the shape of the sensor 550. The cutout 591 may have a depth that substantially matches (or is greater than) the thickness of the sensor 550. In an embodiment, the cutout 591 is over an aperture 561 through the ground plate 590. The aperture 561 may be the location where electrical cabling (e.g., an RF cable) passes through the ground plate 590.

Figure 5C:
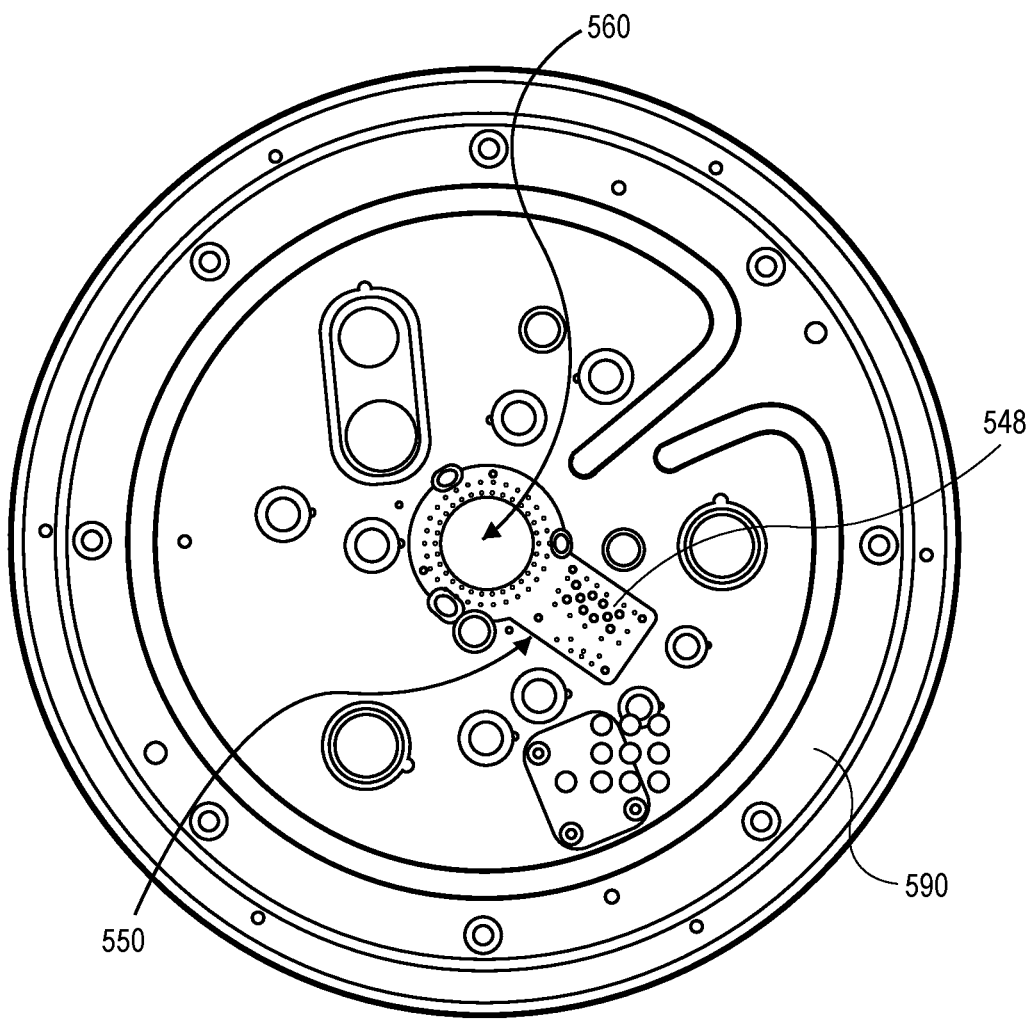
FIG. 5C is a perspective view illustration of the sensor inserted into the ground plate, in accordance with an embodiment.

Referring now to FIG. 5C, a plan view illustration of the ground plate 590 after the sensor 550 is inserted is shown, in accordance with an embodiment. As shown, the aperture 560 in the sensor 550 aligns with the aperture 561 to allow a cable to pass through. The cable induces the sensor pickup surfaces (e.g., the current loop and the voltage ring) to detect current and voltage, which can be fed back to the process power processing module. For example, the feedback may be used in part in order to control an impedance matching network or process power contributing to plasma density and/or plasma sheath voltage.

Figure 6A:
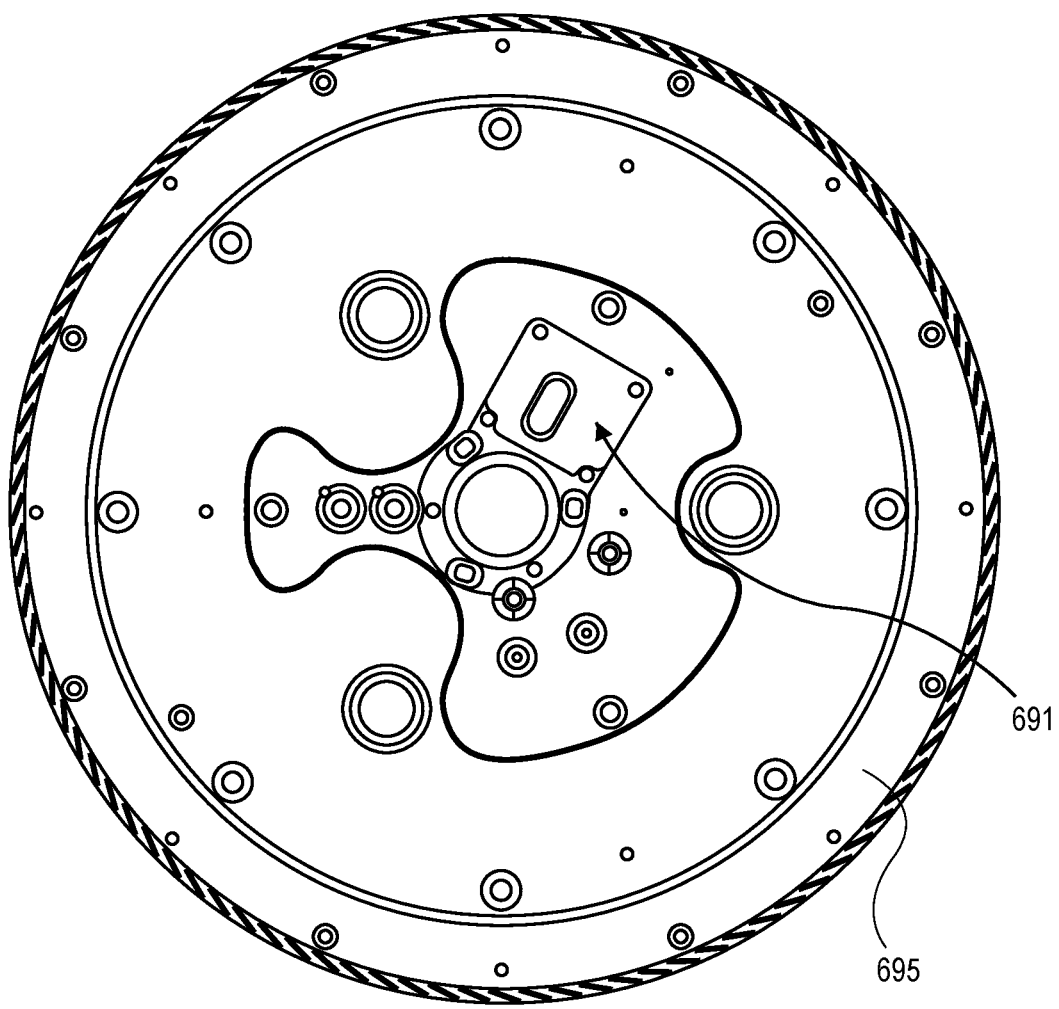
FIG. 6A is a plan view illustration of a ground plate for a symmetric cathode that includes a cutout for a sensor, in accordance with an embodiment.

Referring now to FIG. 6A, a plan view illustration of a ground plate 695 for a symmetric cathode is shown, in accordance with an embodiment. Similar to the embodiment described in FIGS. 5A-5C, the ground plate 695 may include a cutout 691 sized to receive a sensor.

Figure 6B:
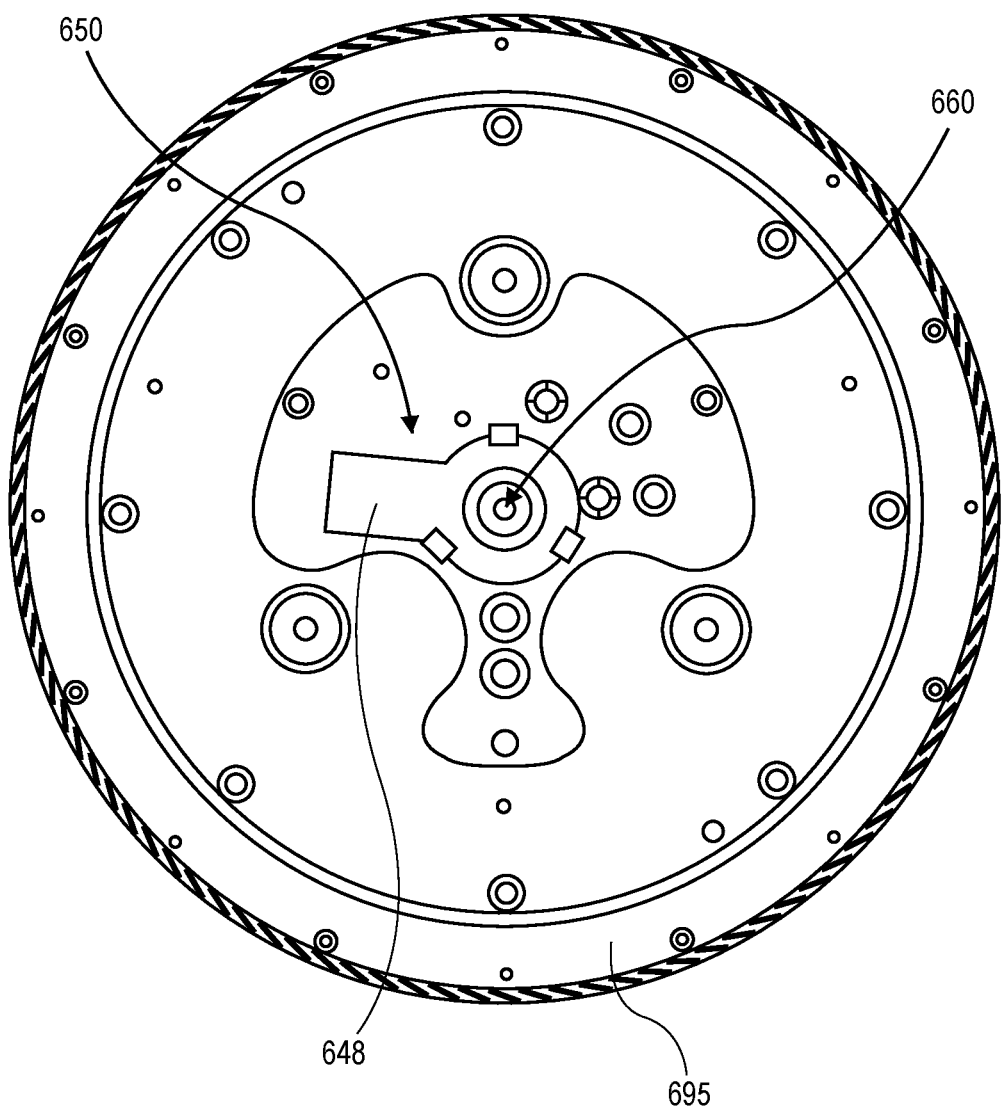
FIG. 6B is a plan view illustration of the ground plate with the sensor inserted into the cutout, in accordance with an embodiment.

Referring now to FIG. 6B, a plan view illustration of the ground plate 695 after the sensor 650 is inserted into the cutout 691 is shown, in accordance with an embodiment. As shown, an aperture 660 of the sensor 650 is positioned so that it receives a cable. The voltage and the current of the cable can be measured by the sensor 650.

While two examples of the integration of sensors into a plasma tool is shown, it is to be appreciated that embodiments are not limited to such configurations. For example, other plasma tool architectures may require movement of the sensors to different locations besides the ground plate. Additionally, similar sensor architectures may be used to measure current and voltage before the impedance matching network, as described in greater detail above. That is to say, embodiments generally include sensors that measure current and voltage through the use of a current loop and a voltage ring formed concentrically around an aperture.

Figure 7:
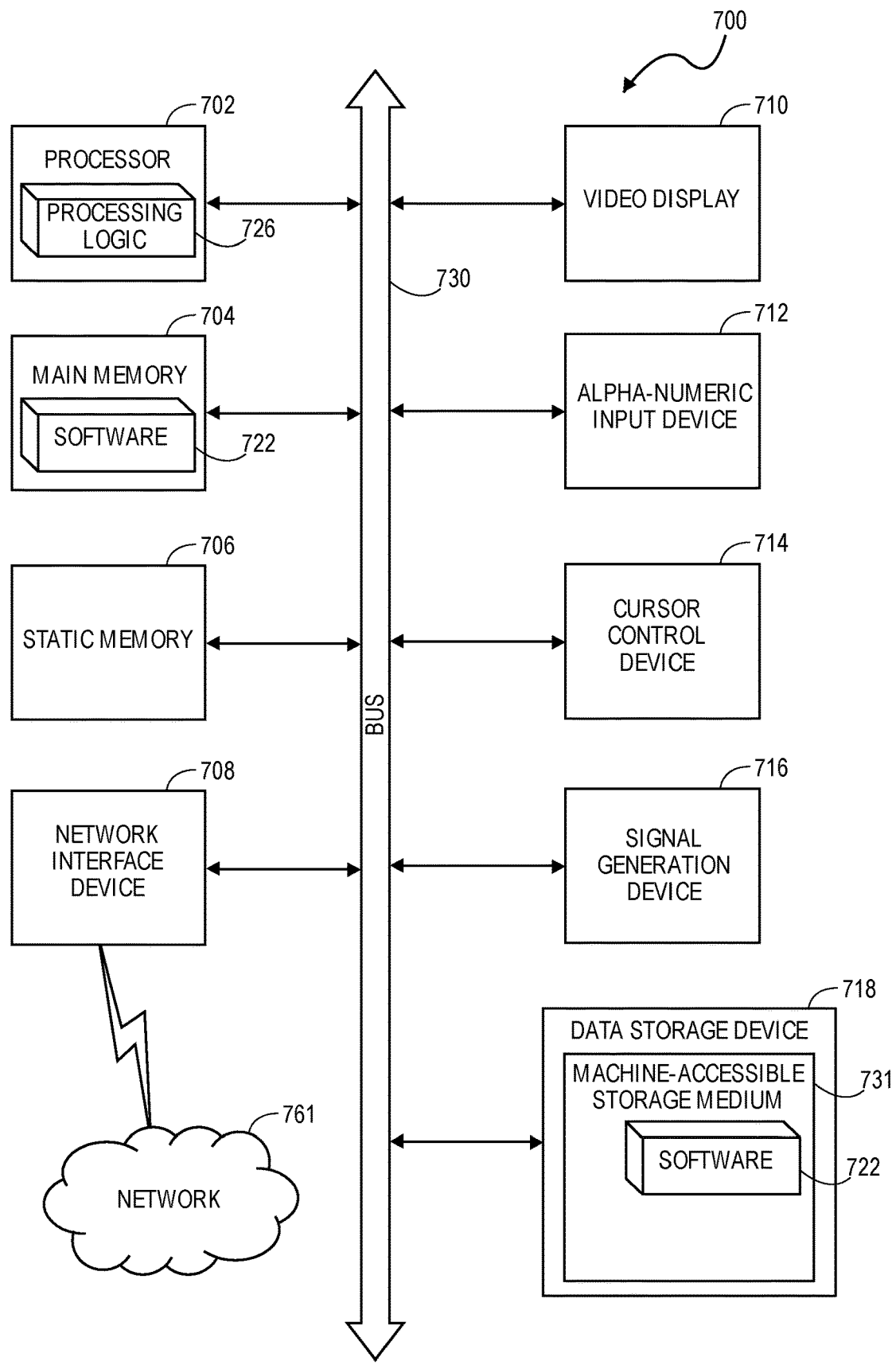
FIG. 7 illustrates a block diagram of an exemplary computer system that may be used in conjunction with a processing tool, in accordance with an embodiment.

Referring now to FIG. 7, a block diagram of an exemplary computer system 700 of a processing tool is illustrated in accordance with an embodiment. In an embodiment, computer system 700 is coupled to and controls processing in the processing tool. Computer system 700 may be connected (e.g., networked) to other machines in a Local Area Network (LAN), an intranet, an extranet, or the Internet. Computer system 700 may operate in the capacity of a server or a client machine in a client-server network environment, or as a peer machine in a peer-to-peer (or distributed) network environment. Computer system 700 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 700, the term "machine" shall also be taken to include any collection of machines (e.g., computers) that individually or jointly execute a set (or multiple sets) of instructions to perform any one or more of the methodologies described herein.

Computer system 700 may include a computer program product, or software 722, having a non-transitory machine-readable medium having stored thereon instructions, which may be used to program computer system 700 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 700 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 700 may further include a system network interface device 708 for communicating with other devices or machines. The computer system 700 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 732 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 700, the main memory 704 and the system processor 702 also constituting machine-readable storage media. The software 722 may further be transmitted or received over a network 720 via the system network interface device 708. In an embodiment, the network interface device 708 may operate using RF coupling, optical coupling, acoustic coupling, or inductive coupling.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A sensor, comprising:
   a board, wherein an aperture is formed through the board;
   a current loop winding through the board around the aperture;

a voltage ring around the aperture and within an inner perimeter of the current loop, wherein the voltage ring comprises:
an interior ring;
an insulator ring around the interior ring; and
an exterior ring around the insulator ring;
a guard ring around the current loop; and
one or more baluns in corresponding cutouts in the guard ring.

2. The sensor of claim 1, wherein the current loop comprises a first winding and a second winding.

3. The sensor of claim 1, wherein the current loop comprises sixteen or more vias through the board.

4. The sensor of claim 1, further comprising:
a total of four baluns in corresponding cutouts in the guard ring along the current loop.

5. The sensor of claim 1, wherein a set of pickup circuitry for the current loop is electrically isolated from a set of pickup circuitry for the voltage ring.

6. The sensor of claim 5, wherein an isolation feature between the current loop and the voltage ring is a grounded via through the board.

7. The sensor of claim 1, wherein the interior ring is an electric field pickup surface, and wherein the exterior ring is grounded.

8. The sensor of claim 1, further comprising:
a second aperture through the board;
a second current loop around the second aperture; and
a second voltage ring within a perimeter of the current loop.

9. The sensor of claim 8, further comprising:
the guard ring around the current loop; and
a second guard ring around the second current loop.

10. The sensor of claim 9, wherein the position of second vias of the second guard ring are rotated relative to the position of first vias of the first guard ring.

11. A sensor, comprising:
a board, wherein an aperture is provided through the board;
a current loop around the aperture, wherein the current loop comprises:
an inner set of vias;
an outer set of vias; and
a plurality of conductive traces, wherein each conductive trace couples a via of the inner set of vias to a via of the outer set of vias, and wherein the plurality of conductive traces alternate from being on a top surface of the board and on a bottom surface of the board;
a voltage ring within an inner perimeter of the current loop, wherein the voltage ring comprises:
an interior ring;
an insulator ring around the interior ring; and
an exterior ring around the insulator ring;
a guard ring around the current loop; and
one or more baluns in corresponding cutouts in the guard ring.

12. The sensor of claim 11, wherein a number of the inner set of vias is equal to a number of the outer set of vias.

13. The sensor of claim 11, wherein a set of pickup circuitry for the current loop is electrically isolated from a set of pickup circuitry for the voltage ring.

14. A processing tool, comprising:
a power supply;
an impedance matching network coupled to the power supply;
a cathode, wherein the power supply is configured to supply power through the impedance matching network to the cathode;
a processing module, wherein the processing module is communicatively coupled to the power supply and the impedance matching network;
a first sensor provided upstream of the impedance matching network and a second sensor provided downstream of the impedance matching network, wherein the first sensor and the second sensor each comprise:
a board, wherein an aperture is formed through the board;
a current loop winding through the board around the aperture;
a voltage ring around the aperture and within an inner perimeter of the current loop, wherein the voltage ring comprises:
an interior ring;
an insulator ring around the interior ring; and
an exterior ring around the insulator ring;
a guard ring around the current loop; and
one or more baluns in corresponding cutouts in the guard ring.

15. The processing tool of claim 14, wherein the current loop comprises a first winding and a second winding.

* * * * *